(12) United States Patent
Volpe

(10) Patent No.: US 8,354,880 B2
(45) Date of Patent: Jan. 15, 2013

(54) OP-R, A SOLID STATE FILTER

(76) Inventor: Gerald Theodore Volpe, Stamford, CT (US)

(*) Notice: Subject to any disclaimer, the term of this patent is extended or adjusted under 35 U.S.C. 154(b) by 0 days.

(21) Appl. No.: 12/653,982

(22) Filed: Dec. 22, 2009

(65) Prior Publication Data

US 2011/0037515 A1 Feb. 17, 2011

Related U.S. Application Data

(60) Provisional application No. 61/274,173, filed on Aug. 13, 2009.

(51) Int. Cl.
*H03K 5/00* (2006.01)
(52) U.S. Cl. .......................... 327/557; 327/552
(58) Field of Classification Search ................ 327/552, 327/553, 555–559
See application file for complete search history.

(56) References Cited

U.S. PATENT DOCUMENTS

| | | | | |
|---|---|---|---|---|
| 3,638,037 A * | 1/1972 | McMurtrie | ........... | 327/557 |
| 4,158,818 A * | 6/1979 | Lerner | ........... | 327/557 |
| 5,296,822 A * | 3/1994 | Cockey, IV | ........... | 330/306 |
| 6,753,725 B2 * | 6/2004 | Grundy | ........... | 327/558 |
| 7,081,788 B2 * | 7/2006 | Hagari | ........... | 327/553 |
| 7,750,730 B2 * | 7/2010 | Irino | ........... | 327/557 |
| 7,843,258 B2 * | 11/2010 | Ishiguro | ........... | 327/556 |

* cited by examiner

*Primary Examiner* — Hai L Nguyen
(74) *Attorney, Agent, or Firm* — St. Onge Steward Johnston & Reens LLC

(57) ABSTRACT

The device described herein proposes an electronic active filter void of capacitors and inductors. The circuit utilizes only operational amplifiers (Op-Amps) and resistors, hence the name Op-R. Although capable of being constructed of lumped circuit elements this filter is intended for integrated circuit (IC) applications. Filtering of signals can be accommodated sub-audio through the video frequency range depending on the selected op-amp ICs. Low pass, band pass, high pass, as well as ban reject frequency responses are achievable. Although the circuits described herein are single input-single output, multiple inputs and outputs present no difficulty, being limited only by chip space. Temperature and production spread variations are also considered within the realm of tenability.

11 Claims, 6 Drawing Sheets

OP-R, A SOLID STATE FILTER

Reference Provisional Patent: U.S. 61/274,1783.

BACKGROUND OF THE INVENTION

1. Field of Invention

The invention is directed toward electrical filters, and in particular to low power applications encountered in, for example, the fields of signal processing, communications, and noise reduction. The invention is directly applicable, but not limited to, integrated circuits.

2. Prior Art

Classically, electrical filters were constructed of lumped circuit passive elements. The elements included were resistors, inductors or coils, and capacitors, usually non-polarized. As electrical engineering evolved it became necessary to reduce the size and weight of these elements. Since the inductor represented the largest volume component there was motivation to remove it. It was later discovered that an amplifier with resistance-capacitance could replace the inductor to get the same effect.

The new method was termed active RC filter design. Although active RC filters could emulate passive filters they required a power supply. Also active RC filter by nature could not handle large power transients. Still the active RC filter presented a small footprint at low cost and had the inherent advantages of signal gain and impedance isolation of load and source.

As the computer age entered solid-state amplifiers became even smaller at even lower power and cost. Now the capacitor element became the size limitation. Although capacitors exist in ICs their needed circuit values were not forthcoming. This was such a problem that digital filters began to emerge. But the need for analog filters remained owing to requirements of pre-aliasing and post smoothing in conjunction with digital filter use.

The demand for higher bandwidth continues to limit the use of digital filters for many applications in the video frequency and UHF frequency ranges. Meanwhile the development of extremely high gain-bandwidth operational amplifiers (Op Amps) continues making active RC quite attractive even with the capacitor element requirement.

It therefore seemed reasonable to search for a filter design method that would employ op-amps with resistor feedback.

SUMMARY OF THE INVENTION

Active RC filters are the most important class of filters in present day analog design. Their popularity stems from the convenient availability of operational amplifiers and the use of feedback lack to replace the inductor component L. Still the capacitor must be physically realized which presents difficulty in achieving practical values on a monolithic chip. The point of this effort is to utilize the op-amp and its internal capacitor $C_c$ as a replacement for L and C components to achieve filtering. We call the specific method defined herein Op-R (Op-amp with resistance R only) filter design.

In classic active RC design the op-amp is chosen with sufficiently high gain-bandwidth through the filter's pass and transition bands. In this way the amplifier's phase shift does not enhance a filter stage's Q factor beyond the design limit (Q enhancement). The op-amp's gain-bandwidth is determined by its internal transistor cut-off frequencies but mainly limited by its internal compensation capacitor $C_c$. The compensation capacitor $C_c$ is required with negative feedback applied due to excess phase shift from the stages of amplification. Otherwise, the amplifier oscillates. Thus, the compensation capacitor $C_c$ is needed to make the op-amp work but compromises gain-bandwidth. In this way no external storage compensation elements are required. The specific method used does not compromise gain-bandwidth because it uses all of the devices' internal amplification potential in the filtering process. This advantage enables the design of wideband filters in the audio, video, and even UHF frequency ranges.

Another advantage of Op-R filters is that besides achieving filtering in a classic second order section-by-section approach, the Op-R method can also be extended to passive filter design. Since passive RLC filters enjoy low sensitivity compared to their active RC counterpart Op-R can likewise realize low sensitivity. Thus, with no L and C components required integrated circuit manufacturing is possible leading to compact reliable design.

A price to be paid for the Op-R technique is the variation of gain-bandwidth over production spread, as well as strong dependency on the amplifier's gain-bandwidth on temperature. Resistor trimming in current mirror circuits deals with the former problem. As to the latter problem, it will be shown that thermal compensation can be used in conjunction with current mirroring to stabilize the filter's performance with temperature

DRAWINGS

Figures

DRAWINGS

Reference Numerals

01 Op-Amp (Operational Amplifier) A1
02 Resistor R2
03 Inductor L3
04 Resistor R4
05 Voltage Source V5
06 Branch Current I6
07 Node Voltage V7

08 Op-Amp A8
09 Resistor R9
10 Resistor R10
11 Capacitor C11
12 Voltage Source V12
13 Branch Current I13
14 Node Voltage V14
15 Voltage Source V15
16 Op-Amp A16
17 Resistor 17
18 Resistor 18
19 Inductor 19
20 Output Node Voltage V20
21 Capacitor C21
22 Resistor R22
23 Resistor R23
24 Output Node Voltage V24
25 Op-Amp A25
26 Voltage Source V26
27 Resistor R27
28 Resistor R28
29 Inductor L29
30 Capacitor C30
31 Output Node Voltage V31
32 Voltage Source V32
33 Resistor R33
34 Inductor L34
35 Capacitor C35
36 Resistor R36
37 Resistor R37
38 Output Node Voltage V38
39 Voltage Source V39
40 Resistor R40
41 OTA $g_1$ (Operational Transconductance Amplifier)
42 OTA $g_2$ (Operational Transconductance Amplifier)
43 OTA $g_3$ (Operational Transconductance Amplifier)
44 OTA $g_4$ (Operational Transconductance Amplifier)
45 Impedance Z
46 Output Node Voltage $V_2$
47 Impedance $R_L$
48 OTA Equivalent Block
49 Transconductance Controlled Source
50 Ideal Transformer Block
51 Series Impedance Block
52 Load Impedance Block
53 Resistor R53
54 Capacitor C54
55 Resistor R55
56 Resistor R56
57 Resistor R57
58 Resistor R58
59 Voltage Source V59
60 Op-Amp A60
61 Op-Amp A61
62 Op-Amp 62
63 Output Node Voltage 62

DETAILED DESCRIPTION

The present invention relates to a solid-state filter realized on a monolithic integrated circuit (IC). The IC is capable of physically realizing a broad class of filters over a wide frequency range. The filter class includes low pass, high pass, band pass, and band reject. The frequency range is either: audio, sub-audio, radio, video or HF, as well as UHF.

An object of the invention is to physically realize filters without the need of inductors or capacitors, and instead, utilizes operational amplifiers (op-amps) and resistors; hence the name OP-R.

Basic Elements

Figure 1:
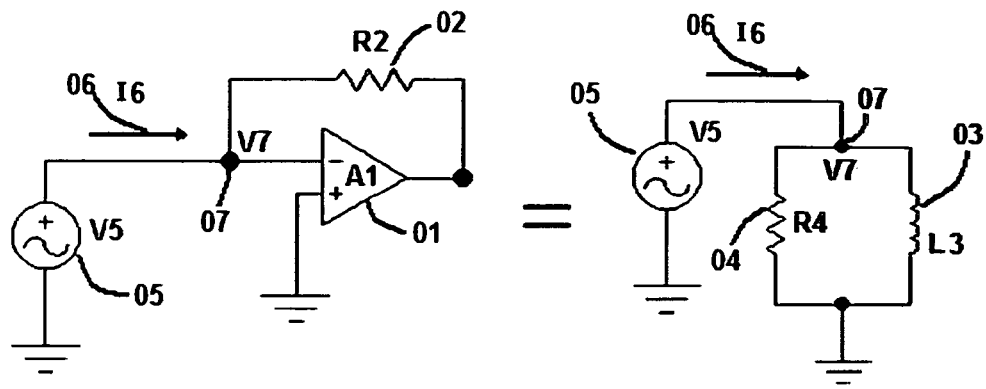
FIG. 1 Illustrates the equivalence of an op-amp with an associated feedback resistor to a lossy inductor.

Starting with the inductance element, FIG. 1 shows the equivalence of an OP-AMP 1 (A1) and an associated feedback RESISTOR 2 (R2) to a lossy inductor composed of INDUCTOR 3 (L3) and its associated parallel RESISTOR 4 (R4). Both equivalent circuits are driven by the same VOLTAGE SOURCE 5 (V5). Each circuit draws CURRENT 6 (I6) and has a responding VOLTAGE 7 (V7). The equivalence of the two circuits is given in terms of the input impedance, as seen by VOLTAGE SOURCE V5, and is described in FIG. 1. In the equivalence, the op-amp gain-bandwidth $\omega_t$ emerges as the main control of the filter inductor L3, which from FIG. 1 is defined by:

$$L3 = \frac{R2}{\omega_t} \quad \text{[Equation (1)]}$$

Figure 2:
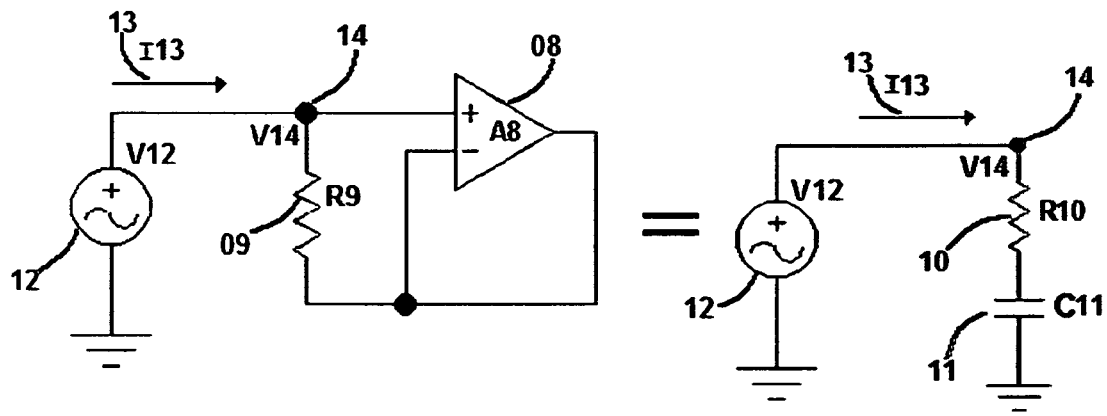
FIG. 2 Illustrates the equivalence of an op-amp with an associated feedback resistor to a lossy capacitor.

Next the capacitance element equivalence is shown in FIG. 2. Here OP-AMP 8 (A8) and RESISTOR 9 (R9) are equivalent to the CAPACITANCE 11 (C11) and its associated series RESISTOR 10 (R10). Again, both circuits are driven by voltage source VOLTAGE SOURCE 12 (V12) and respond with CURRENT 13 (I13) resulting in VOLTAGE 14 (V14). Again the op-amp gain-bandwidth $\omega_t$ controls the capacitor C11 in FIG. 2 defined by:

$$C11 = \frac{1}{R9\omega_t} \quad \text{[Equation (2)]}$$

Basic Filter Realizations

Figure 3:
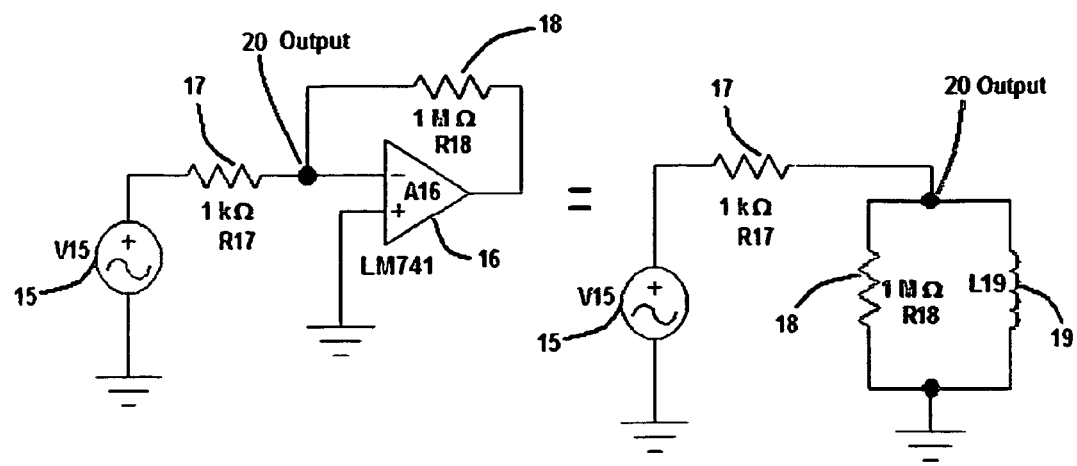
FIG. 3 Illustrates equivalence between op-amp with associated resistors and a passive high pass prototype.

With both inductance and capacitor parameters established, fundamental first order low pass and high pass filters can be realized. FIG. 3 shows high pass filter equivalence between OP-R (left) and the passive high pass prototype (right). In the OP-R high pass filter of FIG. 3 VOLTAGE SOURCE 15 (V15) drives OP-AMP 16 (A16) through RESISTOR 17 (R17). Feedback RESISTOR 18 (R18) realizes the equivalent inductor and the output is taken at node point 20. The equivalent inductor shown in the passive high pass prototype is given as:

$$L19 = \frac{R18}{\omega_t} \quad \text{[Equation (3)]}$$

For the values cited in FIG. 3 the cut-off frequency is given by:

$$f_c = \frac{R17}{2\pi L19} = \frac{R17 f_t}{R18} = \frac{(1\text{ k})(1\text{ MHz})}{1\text{ M}} = 1\text{ kHz} \quad \text{[Equation (4)]}$$

where the nominal value of the op-amp A16's gain-bandwidth is taken as 1 MHz. This value is for the LM741 op-amp shown selected for the audio range.

Figure 4:
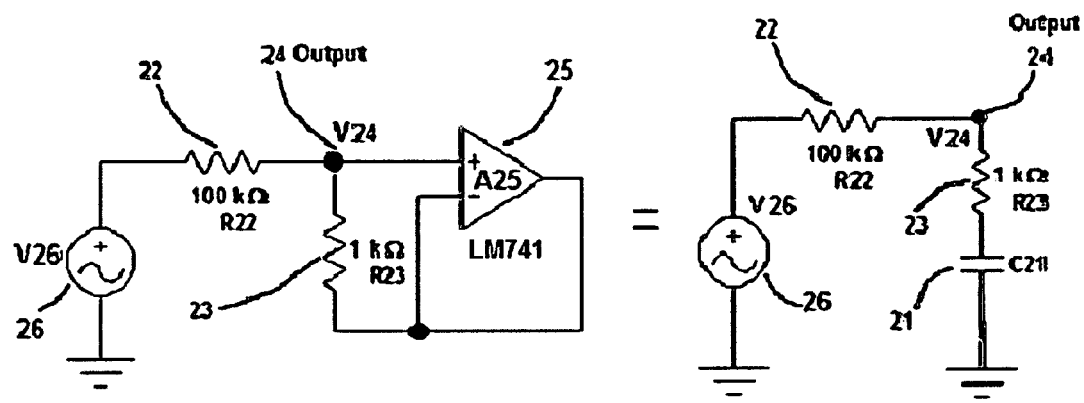
FIG. 4 Illustrates equivalence between op-amp with associated resistors and a passive low pass prototype.

FIG. 4 shows the equivalence between the OP-R circuit and passive low pass prototype filter. Here VOLTAGE SOURCE 26 (V26) drives OP-AMP 25 (A25) through RESISTOR 22 (R22). RESISTOR 23 (R23) realizes the equivalent CAPACITOR 21 (C21) defined as:

$$C21 = \frac{1}{R23\omega_t} \quad \text{[Equation (5)]}$$

Figure 5:
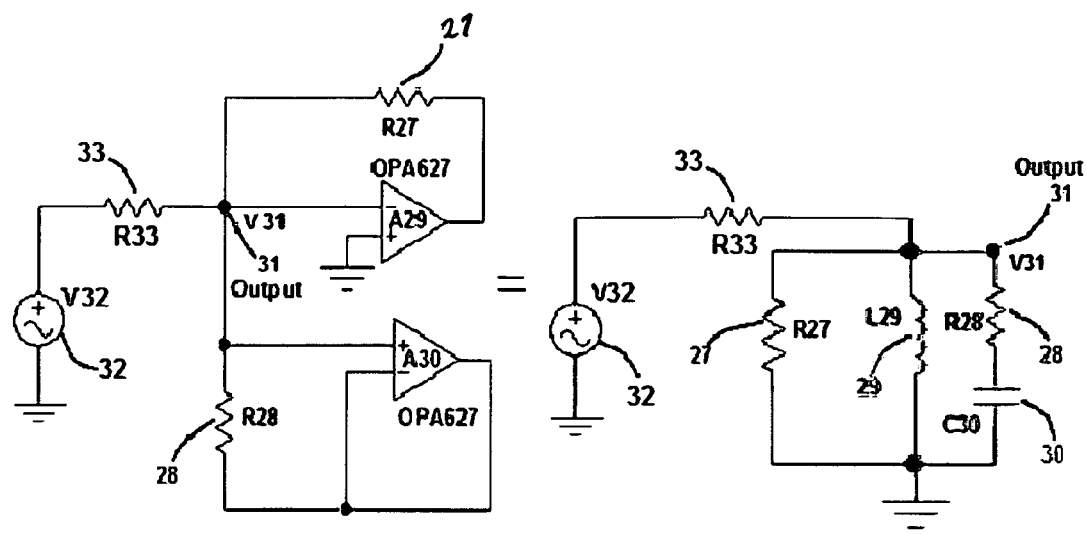
FIG. 5 Illustrates equivalence between op-amp with associated resistors and a passive band pass prototype.

The output is taken at node point 24. For the values cited the cut-off frequency is given by:

$$f_c = \frac{1}{2\pi R22 C21}$$
$$= \frac{R23 f_t}{R22} = \frac{(1\text{ k})(1\text{ MHz})}{100\text{ k}} = 10\text{ kHz} \quad \text{[Equation (6)]}$$

where again the nominal gain-bandwidth of A25 is taken for the LM741 op-amp as 1 MHz Next we turn our attention to the band pass filter. FIG. 5 shows the OP-R and passive band pass prototype filter equivalence. This circuit combines the Op-R's inductor and capacitor in parallel. Both contain lossy resistance elements as previously demonstrated in FIG. 1 and FIG. 2. Their parallel combination in series with a RESISTOR 26 (R26) forms a 0.8 MHz band pass at 1.6 MHz center frequency. In this case the band pass is in the video range as contrasted to the previous low and high pass filters in the audio range. The reason for the higher frequency performance is the choice of Op-Amps 29 and 30 (A29 and A30), namely the OPA627. The OPA627's gain-bandwidth is 16 MHz as compared to 1 MHz for the LM741 in the previous case. As the equivalent inductor/capacitor elements show a higher $\omega_t$ indicates lower equivalent inductor and capacitor values, thereby yielding a higher cut-off frequency filter. The design equations follow from the passive prototype filter as:

$$f_o = \frac{1}{2\pi\sqrt{L29 C30}} = f_t \sqrt{\frac{R28}{R27}} \quad \text{[Equation (7)]}$$

$$BW = \frac{f_o}{Q} = \frac{f_o \sqrt{L29/C30}}{R_{EQ}} \quad \text{[Equation (8)]}$$

$$= \frac{f_t \sqrt{\frac{R28}{R27}} \sqrt{R27 R28}}{R_{EQ}} = \frac{f_t R28}{R_{EQ}}$$

$$R_{EQ} = R33(1+Q_c^2) // R27 // R26; \quad \text{[Equation (9)]}$$

" // means in parallel with"

$$Q_c = \frac{X_c}{R} = \frac{1}{2\pi f_o C30 R28} = \frac{f_t}{f_o} \quad \text{[Equation (10)]}$$

where equations (7) through (10) represent center frequency, 3 dB bandwidth, equivalent parallel resistance, and circuit quality factor, respectively. Using the following numerical values:

R26=14 kΩ  R27=40 kΩ  R28=400Ω  $f_t$=16 MHz (OPA627), $$f_o = 16\text{ M}\sqrt{\frac{0.4\text{ k}}{40\text{ k}}} = 1.6\text{ MHz}$$

$$Q_c = \frac{16}{1.6} = 10$$

$$R_{EQ} = 0.4\text{ k}(1+10^2) // 40\text{ k} // 14\text{ k} = 8.25\text{ k}\Omega$$

$$BW = \frac{16\text{ M}(0.4\text{ k})}{8.25\text{ k}} = 0.78\text{ MHz}$$

Floating Impedances

Figure 6:
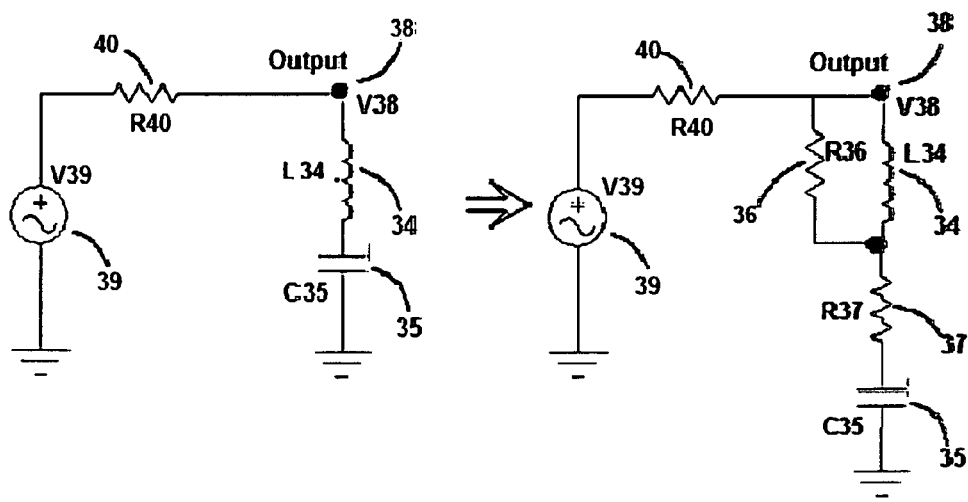
FIG. 6 Illustrates equivalence between a classic passive band reject filter and a passive lossy prototype.
Figure 7:
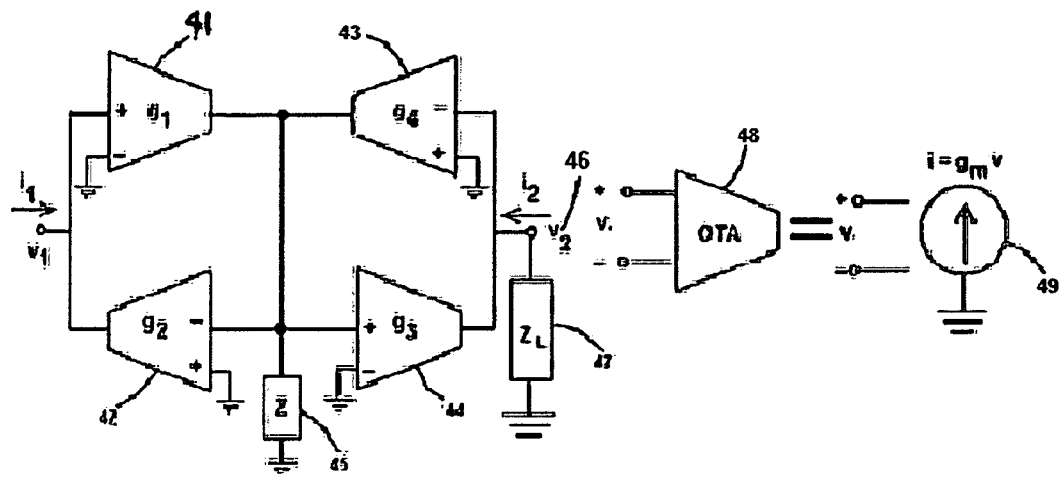
FIG. 7 Illustrates a circuit model in a quad operational transimpedance amplifier (OTA) configuration that realizes a floating impedance inverter FIG. 8 Illustrates an equivalent passive equivalent circuit model of FIG. 7 with ideal transformer FIG. 9 Illustrates how series RC grounded impedance is transformed into a floating lossy inductor to form a floating lossy inductor for a low pass filter.

In order to realize a broader class of filters, one being band reject, it will be necessary to employ floating impedances. FIG. 6 shows an example of a passive band reject prototype filter and its lossy counterpart. The lossy counterpart anticipates the resistances naturally occurring in OP-R equivalent circuits. In both circuits the inductor L34 is a floating impedance element. The lossy band reject circuit is then realized by floating impedance inverters (FII). Then the FII is realized with floating OP-R circuit blocks. MOSFETs can also be used but require biasing circuitry. Our preference here The technique to be employed in realizing floating impedance is the use OTAs (Operational Transconductance Amplifiers)*. OTAs are preferred because they are easier to bias. FIG. 7 shows an FII circuit model in a quad OTA configuration that realizes a scaled floating admittance Y=g²Z, where Z is grounded impedance 45. Elements 41, 42, 43 and 44 represent a plurality of OTAs where g is the transconductance of any OTA, assumed to be equal in value. A single OTA 48 block, shown at the right of the FII circuit block, is defined as an ideal transconductance controlled source 49. The FII output is taken at node 46.

* IEEE Trans. On Circuits & Systems, Theory & Applications, Vol. 43, No. 6, June1996

Figure 8:
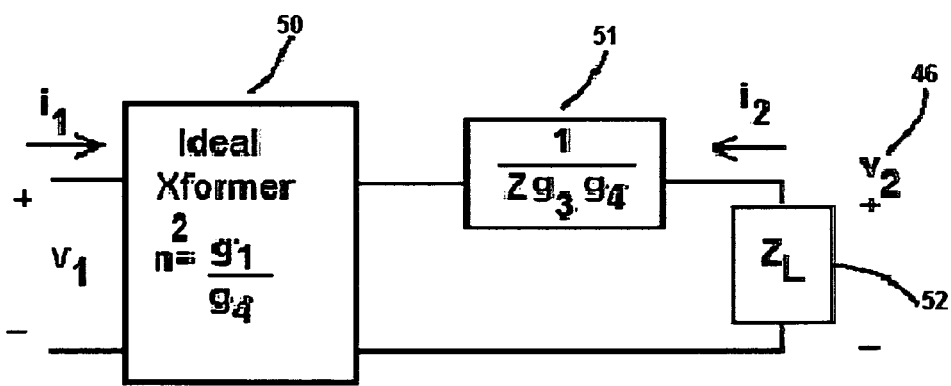
Figure 9:
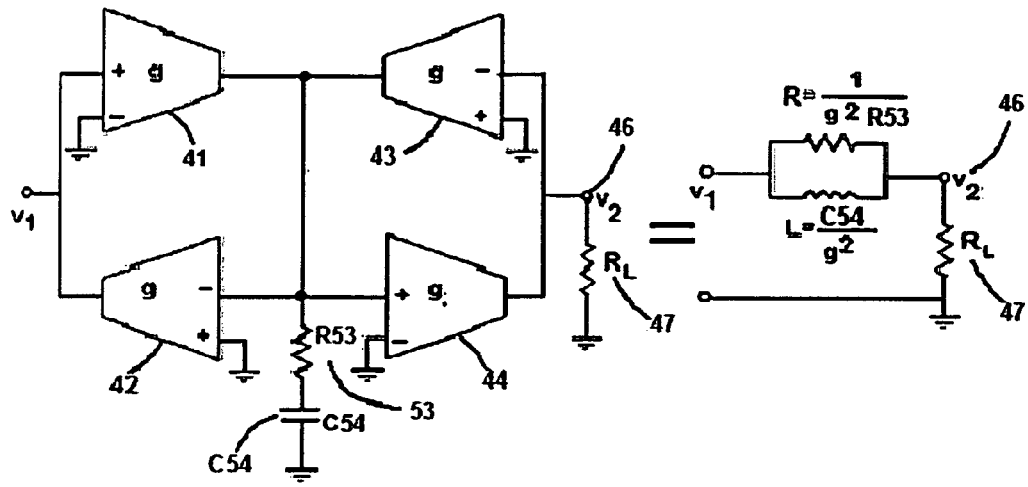
Figure 10:
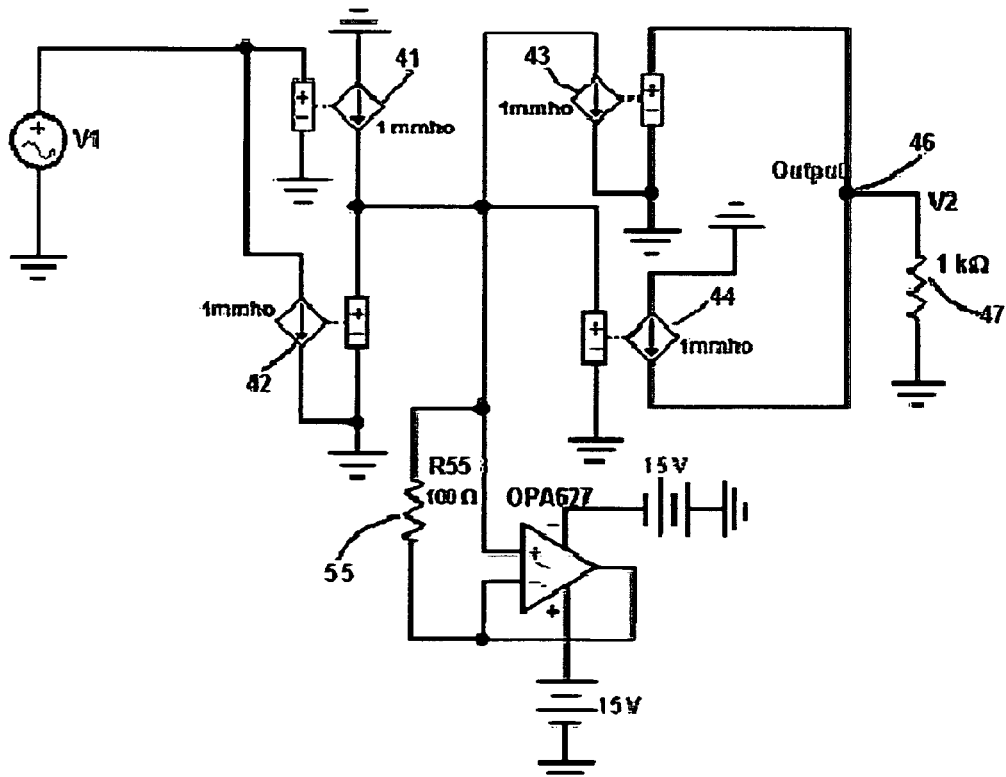
FIG. 10 Illustrates the model of FIG. 9 as an OP-R circuit composed of only OTAs and resistors.

FIG. 8 shows an equivalent passive equivalent circuit model of FIG. 7. For convenience, where the OTA transconductances are assumed to be equal, i.e., g1=g2=g3=g4=g. For example, the F11 of FIG. 8 then transforms the series R53-C54 grounded impedance in the left part of FIG. 9 into a floating lossy inductor in the equivalent circuit at the right part of FIG. 9. This can be termed an FII conversion or transform. The ideal transformer 50 in FIG. 8 vanishes under the assumption that g1=g4=g. Furthermore, the series impedance 51 simplifies to $(Zg^2)^{-1}$ under the assumption that g3=g4=g. Next the OP-R realization for the series R53-C54 results in the complete IC circuit of FIG. 10.

Figure 11:
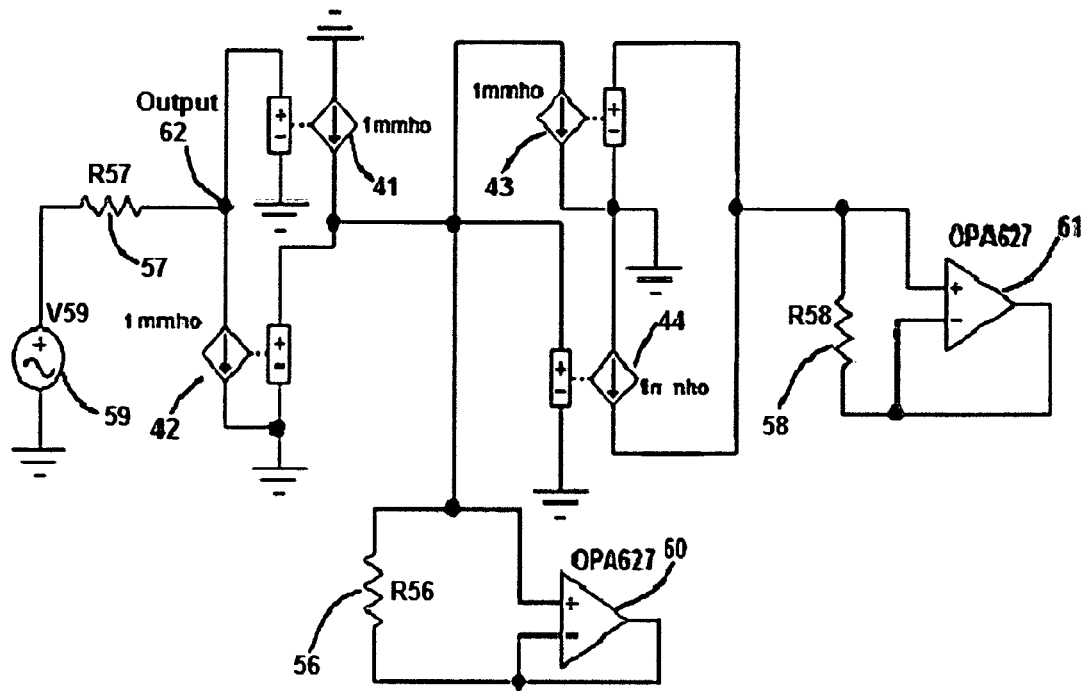
FIG. 11 Illustrates an OP-R circuit of a lossy band reject filter composed of only OTAs and resistors.

We are now in a position to realize the lossy floating inductor L34 in the band reject filter of FIG. 6 employing the same FII technique. In addition, the grounded lossy capacitor comprised of C35 and R37 of FIG. 6 are realized as previously derived in FIG. 2. Combining designs for both floating and grounded elements results in the complete IC of FIG. 11.

Simulations run for all of the filter types demonstrated complete and accurate agreement with theory, thereby establishing the OP-R technique as a viable and useful technique in filter design.

Tunability, Tolerance, and Temperature

Filter design would be incomplete without an adjustment procedure often referred to as tunability. Tunability is required because of component tolerances, also known as production spread, and temperature variations.

The main parameter in OP-R design that affects tunability is the op-amp's gain-bandwidth parameter, $f_t$. It is well known that for an op-amp that the gain-bandwidth is linearly related to transconductance $g_m$ and junction capacitance $C_j$ by:

$$f_t = \frac{g_m}{2\pi C_j}; \; g_m = \frac{I_c}{\phi_T}; \; \phi_T = \frac{kT}{q} \quad \text{[(Equation (11)]}$$

where $I_c$ is the collector current of an intermediate Miller stage, $\phi_T$ is the so-called thermal voltage, k is Boltzman's constant, q is the charge on an electron, and T is absolute temperature in degrees Kelvin. It is easy to see that adjustment of the collector current will afford control of $f_t$, if necessary. This is performed with a current mirror CM. The operation of a current mirror is as follows**:

**A Short Discussion of the Operational Transconductance Amplifier (OTA), Eugene M. Zumchak, February 1999

Figure 12:
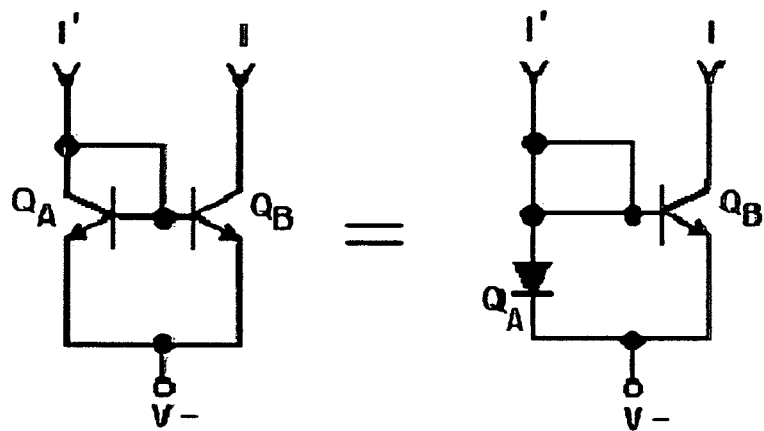
FIG. 12 Illustrates a simple current mirror and an alternate form with a diode.

FIG. 12 shows a simple current mirror, and an alternate form with a diode. An external resistor $R_e$ is connected between the positive rail, say +12 volts, and the collector of $Q_A$. Since the collector of $Q_A$ is connected to its base there is just a diode drop from collector to emitter. Let us assume that this diode drop is 0.6 volts. Thus, if V. is at ground potential the voltage across resistor $R_e$ is 11.4 volts. Otherwise, if it is at the negative rail, say −12 volts, then the voltage across resistor $R_e$ is 23.4 volts. In either case the resistor value can be selected to fix the current I'. I' is the sum of the base current and the collector current (beta times the base) of $Q_A$, where the base current is defined by resistor $R_e$. Since transistors $Q_A$ and $Q_B$ are monolithic and matched, and their base-emitter junctions are in parallel, whatever collector current flows in $Q_A$ defines the same collector current I in $Q_B$. We say that I is a mirror of I'. Also, since transistor $Q_A$ acts like a diode, it is typically shown as a diode, as in the right side of FIG. 12. For our case, current I is the current that establishes $g_m$ and hence the gain-bandwidth $f_t$. Thus, the external resistor $R_e$ tunes $f_t$ and hence the equivalent OP-R's L and C components. Furthermore, since the product of L and C yields a filter's critical frequency $f_n$ or $f_o$, while the ratio of L and C yields stage Q, the external resistor $R_e$ tunes the filter's critical frequency while not affecting its Q factors or frequency response shape.

What is claimed is:

1. A filter comprising:
 a voltage source having a first connection point coupled to ground;
 a first resistor having a first end coupled to a second connection point of said voltage source;
 a first operational amplifier having an inverting input coupled to a second end of said first resistor;
 said first operational amplifier having a non-inverting input coupled to ground;
 a second resistor having a first end coupled to the inverting input of said first operational amplifier, said second resistor having a second end coupled to an output of said first operational amplifier;
 a second operational amplifier having a non-inverting input coupled to the second end of said first resistor;
 a third resistor having a first end connected to the non-inverting input of said second operational amplifier;
 said third resistor having a second end connected to an inverting input of said second operational amplifier;
 said second operational amplifier having an output coupled to the second end of said third resistor.

2. The filter according to claim 1 wherein said filter is integrated onto a single substrate.

3. The filter according to claim 2 wherein said filter is tuned for a selected frequency response.

4. The filter according to claim 2 wherein said filter automatically provides thermal compensation to offset effects of temperature change on the filter.

5. The filter according to claim 1 wherein an equivalent inductor is calculated by the following formula:

$$L19 = \frac{R18}{\omega_t} = \frac{R18}{2\pi f_t}$$

wherein L19 is an equivalent inductor and R18 is said second resistor.

6. The filter according to claim 5 wherein a cut-off frequency is given by the following formula:

$$f_c = \frac{R17}{2\pi L19}$$

wherein $f_c$ is a cut-off frequency, L19 is the equivalent inductor and R17 is said first resistor.

7. The filter according to claim 1 wherein said filter is integrated onto a single substrate.

8. The filter according to claim 1 wherein said filter is tuned for a selected frequency response.

9. The filter according to claim 1 wherein said filter automatically provides thermal compensation to offset effects of temperature change on the filter.

10. The filter according to claim 1 wherein an equivalent capacitor is calculated by the following formula:

$$C21 = \frac{1}{R23\omega_t}$$

wherein C21 is an equivalent capacitor and R23 is said third resistor.

11. The filter according to claim 10 wherein a cut-off frequency is given by the following formula:

$$f_c = \frac{1}{2\pi R22 C21}$$

wherein $f_c$ is a cut-off frequency, C21 is the equivalent capacitor and R22 is said first resistor.

* * * * *